United States Patent
Schaepkens

(10) Patent No.: US 7,112,352 B2
(45) Date of Patent: Sep. 26, 2006

(54) APPARATUS AND METHOD FOR DEPOSITING LARGE AREA COATINGS ON PLANAR SURFACES

(75) Inventor: Marc Schaepkens, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/626,253

(22) Filed: Jul. 23, 2003

(65) Prior Publication Data

US 2005/0079295 A1   Apr. 14, 2005

Related U.S. Application Data

(62) Division of application No. 09/683,149, filed on Nov. 27, 2001.

(51) Int. Cl.
*H05H 1/24* (2006.01)
*H01L 21/31* (2006.01)

(52) U.S. Cl. .................... 427/569; 438/788
(58) Field of Classification Search ........ 427/569, 427/577, 578, 579, 446, 450; 438/788, 789, 438/792, 793; 118/723 E, 723 ER; 156/345.43, 156/345.46, 345.47
See application file for complete search history.

(56) References Cited

U.S. PATENT DOCUMENTS

| 4,871,580 A | 10/1989 | Schram et al. |
|---|---|---|
| 4,957,062 A | 9/1990 | Schuurmans et al. |
| 5,120,568 A | 6/1992 | Schuurmans et al. |
| 5,560,779 A * | 10/1996 | Knowles et al. ...... 118/723 MP |
| 5,620,523 A * | 4/1997 | Maeda et al. .......... 118/723 IR |
| 5,985,378 A * | 11/1999 | Paquet ...................... 427/562 |
| 6,189,485 B1 * | 2/2001 | Matsuda et al. ......... 118/723 E |
| 6,213,049 B1 | 4/2001 | Yang |
| 6,383,953 B1 * | 5/2002 | Hwang ...................... 438/788 |

OTHER PUBLICATIONS

"*Temperature and Growth-Rate Effects on the Hydrogen Incorporation in Hydrogenated Amorphous Silicon*", WMM Kessels et al., Department of Applied Physics, Eindhoven University of Technology, 1998, pp. 29-33.

"*Improvement of Hydrogenated Amorphous Silicon Properties With Increasing Contribution of SiH,to Film Growth*", WMM Kessels et al., Department of Applied Physics, Eindhoven University of Technology, pp. 107-110.

* cited by examiner

*Primary Examiner*—Luz Alejandro-Mulero
(74) *Attorney, Agent, or Firm*—Andrew J. Caruso; William E. Powell, III

(57) ABSTRACT

A method and apparatus for depositing a uniform coating on a large area, planar surface using an array of multiple plasma sources and a common reactant gas injector. The apparatus includes at least one array of a plurality of plasma sources, wherein each of the plurality of plasma sources includes a cathode, an anode, and an inlet for a non-reactive plasma source gas disposed in a plasma chamber, and a common reactant gas injector disposed in a deposition chamber that contains the substrate. The common reactant gas injector provides a uniform flow of at least one reactant gas to each of the multiple plasmas generated the multiple plasma sources through a single delivery system. The at least one reactant gas reacts with the plurality of plasmas to form a uniform coating on a substrate.

8 Claims, 6 Drawing Sheets

APPARATUS AND METHOD FOR DEPOSITING LARGE AREA COATINGS ON PLANAR SURFACES

This is a division of application Ser. No. 09/683,149, filed Nov. 27, 2001.

BACKGROUND OF INVENTION

The invention relates to an apparatus and method for depositing a uniform coating on a planar surface. More particularly, the invention relates to a method and apparatus for depositing a uniform coating on a planar surface using multiple plasma sources. Even more particularly, the invention relates to a method and apparatus for depositing a uniform coating on a planar surface by injecting reactant gases through a common injection system into a plurality of plasmas that are generated by multiple expanding thermal plasma sources.

Plasma sources are capable of depositing a large variety of coatings, such as transparent abrasion resistant coatings, transparent UV-filtering coatings, and multi-layer coating packages on a substrate at a high deposition rate. In such deposition processes, a reactant gas interacts with a plasma to form species that are deposited on the substrate. Individual plasma sources, such as expanding thermal plasma (also referred to hereinafter as "ETP") sources, can be used to uniformly coat areas having a diameter in the range of about 10–15 cm.

An array of multiple plasma sources may be used to coat larger substrate areas. Such large area coating work typically deals with depositing a coating on macroscopically flat—or planar—surfaces. To achieve a uniform coating on such planar surfaces, the multiple plasma sources may be spaced in a two-dimensional pattern, such as a linear or zigzag array.

When multiple plasma sources are used to coat large areas, reactant gas is typically provided to each plasma source by a separate delivery system; i.e., each plasma source has an individual reactant gas source that requires individual flow control. When scaling plasma deposition technology up to coat surfaces having larger dimensions, however, the use of the individual reactant sources and flow controllers may cause significant variability in the coating process and a resulting decrease in coating uniformity. In addition, as the number of plasma sources used in the coating process increases, the cost to equip each plasma source with an individual delivery system and flow control becomes significant.

An array of multiple plasma sources in which each plasma source has an individual reactant gas injector system is unable to uniformly coat large planar surfaces and is uneconomical. Therefore, what is needed is a method and apparatus for uniformly coating a large area, planar substrate using multiple plasma sources.

SUMMARY OF INVENTION

The present invention meets these and other needs by providing both a method and apparatus for depositing a uniform coating on a large area, planar surface using an array of multiple plasma sources and a common precursor— or reactant gas—injector. By providing the reactant gas (or gases) to the multiple plasma sources through a single delivery system, a uniform flow of reactant gas to each of the multiple plasmas can be easily maintained.

Accordingly, one aspect of the invention is to provide an apparatus for depositing a uniform coating on a planar surface of a substrate. The apparatus comprises: at least one array of a plurality of plasma sources for generating a plurality of plasmas, wherein each of the plurality of plasma sources includes a cathode, an anode, and an inlet for a non-reactive plasma source gas disposed in a plasma chamber; a deposition chamber for containing the substrate, wherein the deposition chamber is in fluid communication with the plasma chamber, and wherein the plasma chamber is maintained at a first predetermined pressure and the deposition chamber is maintained at a second predetermined pressure that is less than the first predetermined pressure; and at least one at least one common reactant gas injector disposed in the deposition chamber for providing a uniform flow rate of at least one reactant gas into each of the plurality of plasmas.

A second aspect of the invention is to provide a common reactant gas injector for injecting a uniform flow of at least one reactant gas into a plurality of plasmas generated by an array of a plurality of plasma sources. The common reactant gas injector comprises: a reactant gas inlet comprising a tubular-walled structure having an interior space through which the at least one reactant gas is supplied from at least one reactant gas source; a first plurality of orifices proximate to a first plasma, each of the first plurality of orifices extending through the tubular-walled structure from the interior space to an outer surface of the reactant gas inlet, wherein the first plurality of orifices is oriented such that the at least one reactant gas passes from the interior space through the first plurality of orifices and is directed into the first plasma at a first flow rate; and a second plurality of orifices proximate to a second plasma, each of the second plurality of orifices extending through the tubular-walled structure from the interior space to an outer surface of the reactant gas inlet, wherein the second plurality of orifices is oriented such that the at least one reactant gas passes from the interior space through the second plurality of orifices and is directed into the second plasma at a second flow rate, the second flow rate being substantially equal to the first flow rate.

A third aspect of the invention is to provide an apparatus for depositing a uniform coating on a planar surface of a substrate. The apparatus comprises: at least one array of a plurality of plasma sources for generating a plurality of plasmas, wherein at least one of the plurality of plasma sources is an expanding thermal plasma source, wherein each of the plurality of plasma sources includes a cathode, an anode, and an inlet for a non-reactive plasma source gas disposed in a plasma chamber; a deposition chamber for containing the substrate, wherein the deposition chamber is in fluid communication with the plasma chamber, and wherein the plasma chamber is maintained at a first predetermined pressure and the deposition chamber is maintained at a second predetermined pressure that is less than the first predetermined pressure; and at least one common reactant gas injector disposed in the deposition chamber for injecting a uniform flow of at least one reactant gas into each of the plurality of plasmas. The common reactor injector comprises: a reactant gas inlet comprising a tubular-walled structure having an interior space through which the reactant gas is supplied from at least one reactant gas source; a first plurality of orifices proximate to a first plasma, each of the first plurality of orifices extending through the tubular-walled structure from the interior space to an outer surface of the reactant gas inlet, wherein the first plurality of orifices is oriented such that the reactant gas passes from the interior space through the first plurality of orifices and is directed into the first plasma at a first flow rate; and a second plurality of orifices proximate to the second plasma, each of the second plurality of orifices extending through the tubular-walled structure from the interior space to an outer surface of the at least one reactant gas inlet, wherein the second plurality of orifices is oriented such that the reactant gas passes from the interior space through the second plurality of orifices and is directed into the second plasma at a second flow rate, the second flow rate being substantially equal to the first flow rate.

A fourth aspect of the invention is to provide a method of depositing a uniform coating on a planar surface of a substrate. The method comprises the steps of: providing the substrate having the planar surface to a deposition chamber; evacuating the deposition chamber to a predetermined deposition pressure; generating a plurality of plasmas from at least one array of a plurality of plasma sources; injecting at least one reactant gas into each of the plurality of plasmas through at least one common reactant gas injector such that a first flow rate of the at least one reactant gas into a first plasma is substantially equal to a second flow rate of the at least one reactant gas into a second plasma; flowing the at least one reactant gas and the plurality of plasmas into the deposition chamber toward the substrate; and reacting the at least one reactant gas with the plurality of plasmas to form the coating on the non-planar surface of the substrate.

A fifth aspect of the invention is to provide a method of injecting a reactant gas into a plurality of plasmas generated by an array of a plurality of plasma sources such that a first flow rate of the at least one reactant gas into a first plasma is substantially equal to a second flow rate of the at least one reactant gas into a second plasma. The method comprises the steps of: supplying the at least one reactant gas from a reactant gas source to a common reactant gas injector; passing the at least one reactant gas through a first plurality of orifices in the common reactant gas injector proximate to the first plasma, wherein the first plurality of orifices is oriented such that the at least one reactant gas is directed into the first plasma at a first predetermined flow rate; and passing the at least one reactant gas through a second plurality of orifices in the common reactant gas injector proximate to the second plasma, wherein the second plurality of orifices is oriented such that the at least one reactant gas is directed into the second plasma at a second predetermined flow rate, wherein the second predetermined flow rate is substantially equal to the first predetermined flow rate.

A sixth aspect of the invention is to provide a substrate having a uniform coating deposited on a planar surface, wherein the uniform coating is deposited by: providing the substrate having the planar surface to a deposition chamber, wherein the deposition chamber is in fluid communication with at least one array of a plurality of plasma sources, wherein at least one of the plurality of plasma sources is an expanding thermal plasma source having a cathode, an anode and an inlet for a non-reactive plasma source gas disposed in a plasma chamber, the plasma chamber being in fluid communication with the deposition chamber; evacuating the deposition chamber to a predetermined deposition pressure and the plasma chamber to a predetermined first pressure, wherein the predetermined deposition pressure is less than the predetermined first pressure; generating a plurality of plasmas in the plurality of plasma sources and flowing the plurality of plasmas into the deposition chamber; injecting at least one reactant gas through at least one common gas injector into each of the plurality of plasmas as the plurality of plasmas flows into the deposition chamber such that a first flow rate of the at least one reactant gas into a first plasma is substantially equal to a second flow rate of the at least one reactant gas into a second plasma; flowing the at least one reactant gas and the plurality of plasmas into the deposition chamber toward the substrate; and reacting the at least one reactant gas with each of the plurality of plasmas to form the coating on the planar surface of the substrate.

These and other aspects, advantages, and salient features of the present invention will become apparent from the following detailed description, the accompanying drawings, and the appended claims.

BRIEF DESCRIPTION OF DRAWINGS

FIG. 7 is a schematic representation showing a common reactant gas injector having a different linear densities of orifices in regions A and B.

DETAILED DESCRIPTION

Figure 1:
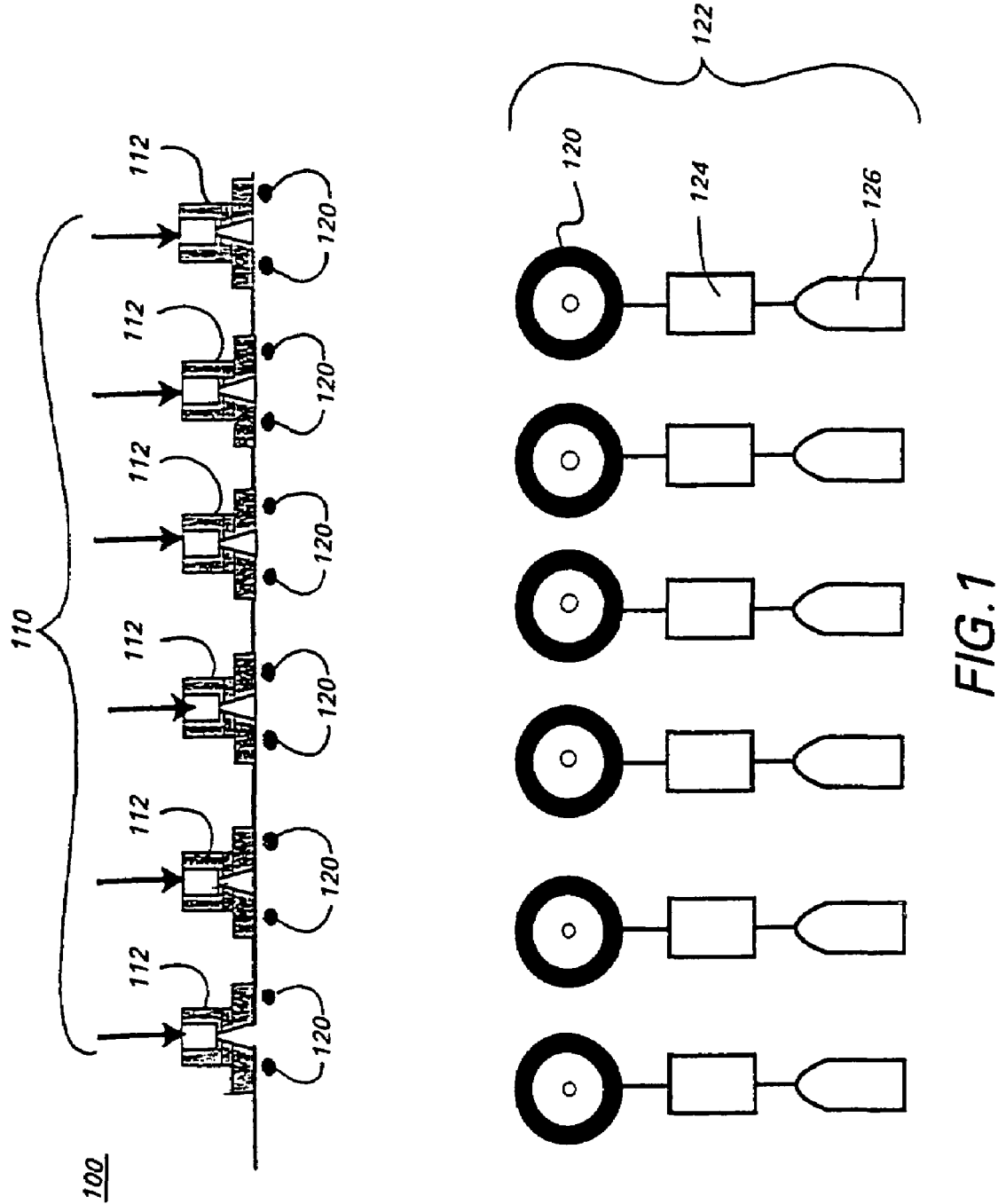
FIG. 1 is a schematic representation of an apparatus for depositing a uniform coating on a macroscopically planar surface using an array of expanding thermal plasma sources, in which reactant gas is provided to each of the plasma sources by an individual reactant gas injector.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. An apparatus 100 for depositing a uniform coating on a macroscopically planar—or flat—surface using an array 110 comprising a plurality of expanding thermal plasma sources 112 is schematically shown in FIG. 1. The apparatus 100 shown in FIG. 1 has been described in "Apparatus and Method for Large Area Chemical Vapor Deposition Using Expanding Thermal Plasma Generators," U.S. patent application Ser. No. 09/681,820, by Barry Lee-Mean Yang et al.

now U.S. Pat. No. 6,397,776, and in "Apparatus and Method for Depositing Large Area Coatings on Non-Planar Surfaces," U.S. patent application Ser. No. 09/683,148, by Marc Schaepkens, both of which are incorporated herein by reference in their entirety. Each of the plurality of ETP sources 112 is supplied with at least one reactant gas that reacts with the generated ETP to form a coating on a surface of a substrate (not shown). The at least one reactant gas is supplied to each of the plurality of ETP sources 112 at the same flow rate through individual reactant gas injectors 120. The at least one reactant gas reacts in the plasma generated by each of the plurality of ETP sources 112 to produce species that form the coating.

When multiple plasma sources are used to coat large areas, reactant gas is typically provided to each plasma source by a separate delivery system; i.e., each plasma source has an individual reactant gas source that requires individual flow control. Individual reactant gas injectors 120 are usually provided to each of the plurality of ETP sources 112, as shown in FIG. 1. In the embodiment shown in FIG. 1, the at least one reactant gas passes through individual ring injectors 120, shown in top and cross-sectional views in FIG. 1, into each of the plasmas generated by each of the plurality of ETP sources 112. Each of the at least one reactant gas is provided to individual ring injectors 120 from individual reactant gas sources 126, with individual flow controllers 124 regulating the flow of the at least one reactant gas from each of the individual reactant gas sources 126 to each of the individual ring injectors 120. Alternatively, individual nozzles (not shown) may be substituted for the individual ring injectors 120.

When scaling plasma deposition technology up to coat surfaces having larger dimensions, the use of individual ring injectors 120, individual reactant sources 126, and flow controllers 124 may cause significant variability in the coating process and a resulting decrease in coating uniformity. In addition, as the number of plasma sources used in the coating process increases, the cost to equip each plasma source with an individual delivery system and flow control becomes significant.

It is generally desirable to produce a coating having a uniform profile of at least one selected property across the entire coated surface. Such properties include, but are not limited to, coating thickness, abrasion resistance, radiation absorption, and radiation reflectivity. Each of the profiles of such properties in a coating deposited by a single plasma source, such as an ETP source, has a Gaussian distribution about the axis of the plasma source. The size and shape of the Gaussian distribution will depend in part on the temperature of the plasma, which in turn is dependent upon the power used to generate the plasma and the flow rate of the at least one reactant gas into the plasma. For plasmas generated at the same power and substantially equal flow rates of the at least one reactant gas into each of the plurality of plasmas, a uniform profile of a given coating property across a planar surface may be obtained by arranging the plurality of plasma sources in an array such that the Gaussian distributions produced by the individual plasma sources overlap.

Figure 2:
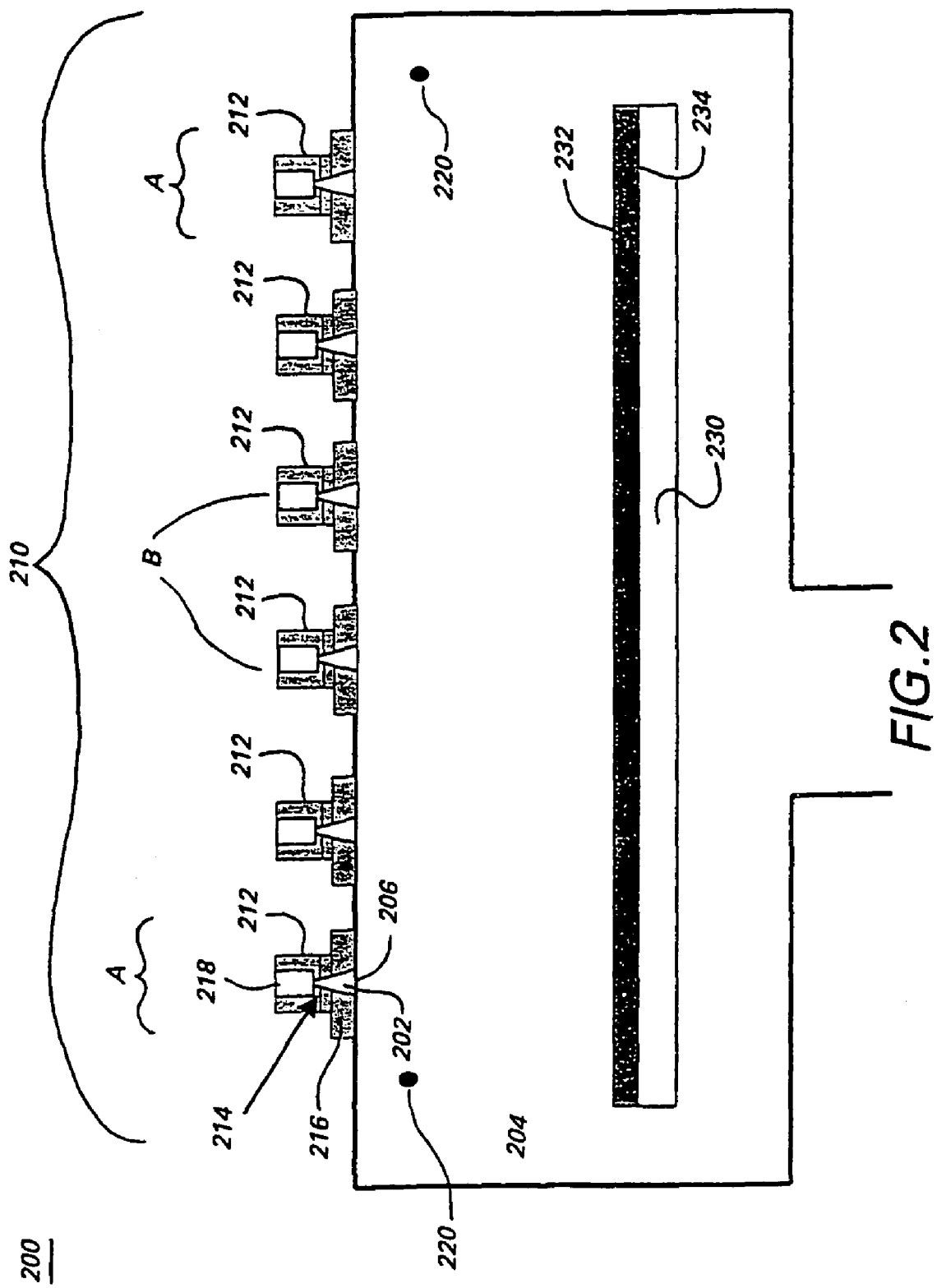
FIG. 2 is a schematic representation of an apparatus of the present invention for depositing a uniform coating on a macroscopically planar substrate using an array of expanding thermal plasma sources.

An apparatus 200 for depositing a uniform coating on a non-planar surface according to the present invention is shown in FIG. 2. The apparatus 200 includes at least one array 210 of a plurality of plasma sources 212. The apparatus may include as many arrays as is practical and necessary for coating non-planar substrate 230. Similarly, each array 210 may include as many plasma sources 212 as is practical or necessary. In one embodiment, the plurality of plasma sources 212 includes at least one ETP plasma source. While FIG. 2 shows a single array 210 having six plasma sources 212, multiple arrays 210, and at least one array 210 having more than six plasma sources 212 are also considered to be within the scope of the invention. Array 210, for example, may include up to about 12 plasma sources 212. The array 210 may be either a linear array or a two-dimensional array, such as, but not limited to, staggered arrays, zigzag arrays, grids, and polygons (e.g., triangular, hexagonal, octagonal, and the like) of plasma sources 212.

Each of the plurality of plasma sources 212 includes a cathode 214, an anode 216, and a plasma source gas inlet 218 disposed in a plasma chamber 202. The plasma source gas is an inert gas, such as a noble gas; i.e., argon, helium, neon, krypton, or xenon. Alternatively, other chemically unreactive gases, such as, but not limited to, nitrogen and hydrogen, may be used as the plasma source gas. Preferably, argon is used as the plasma source gas. A plasma is generated at each of the plurality of plasma sources 212 by striking an arc between cathode 214 and anode 216 while introducing the plasma source gas into the arc through plasma source gas inlet 218.

In one embodiment, at least one of the plurality of plasma sources 212 is an expanding thermal plasma (also referred to hereinafter as "ETP"). In an ETP, a plasma is generated by ionizing the plasma source gas in the arc generated between at least one cathode and an anode to produce a positive ion and an electron. The following reaction, for example, occurs when an argon plasma is generated:

$$Ar \rightarrow Ar^+ + e^-.$$

The plasma is then expanded into a high volume at low pressure, thereby cooling the electrons and positive ions. In the present invention, the plasma is generated in plasma chamber 202 and expanded into deposition chamber 204 through opening 206. As previously described, deposition chamber 204 is maintained at a significantly lower pressure than the plasma chamber 202. Consequently, the electrons in the ETP are too cold and thus have insufficient energy to cause direct dissociation of the at least one reactant gas within the ETP. Instead, the at least one reactant gas that is introduced into the plasma may undergo charge exchange and dissociative recombination reactions with the electrons within the ETP. In an ETP, the positive ion and electron temperatures are approximately equal and in the range of about 0.1 eV (about 1000 K). In other types of plasmas, the electrons have a sufficiently high temperature to substantially affect the chemistry of the plasma. In such plasmas, the positive ions typically have a temperature of about 0.1 eV, and the electrons have a temperature of about 1 eV, or 10,000 K.

Plasma chamber 202 is in fluid communication with deposition chamber 204 through opening 206. Deposition chamber 204 is in fluid communication with a vacuum system (not shown), which is capable of maintaining the deposition chamber 204 at a pressure that is lower than that of the plasma chamber 202. In one embodiment, the deposition chamber 204 is maintained at a pressure of less than about 1 torr (about 133 Pa) and, preferably, at a pressure of less than about 100 millitorr (about 0.133 Pa), while plasma chamber 202 is maintained at a pressure of at least about 0.1 atmosphere (about $1.01 \times 10^4$ Pa). Plasma chamber 202 is preferably maintained at a pressure of about one atmosphere (about $1.01 \times 10^5$ Pa).

At least one common reactant gas injector 220 is located in deposition chamber 204 for providing at least one reactant gas at a predetermined flow rate into each of the plurality of plasmas generated by the plurality of plasma sources 212 in array 210. Common reactant gas injector 220 is shown in cross-sectional and top views in FIG. 3. The at least one reactant gas is provided to the common reactant gas injector 220 from at least one reactant gas source (226 in FIG. 3) by a reactant gas injector system (222 in FIG. 3), which includes a flow controller (224 in FIG. 3) to regulate the flow of the at least one reactant gas from the reactant gas source 226 to the common reactant gas injector 220. The at least one reactant gas source 224 may be either a single reactant gas source, in which case a single flow controller 222 can be used, or a manifold in which various reactant gases, or precursors, are mixed prior to injection into the plurality of plasmas.

The at least one reactant gas is provided through the common reactant gas injector 220 to each of the plurality of plasmas generated by the plurality of plasma sources 212 in array 210 as the plasmas enter into the deposition chamber 204 through opening 206. The at least one reactant gas flows into each of the plasmas from common reactant gas injector 220 at substantially the same flow rate. The at least one reactant gas may comprise a single reactant gas or a mixture of reactant gases, and may be provided from a single reactant gas source or separate, multiple reactant gas sources 226 to either a single the common reactant gas injector 220 or separate common reactant gas injectors 220 by separate reactant gas injector systems 222.

Figure 3:
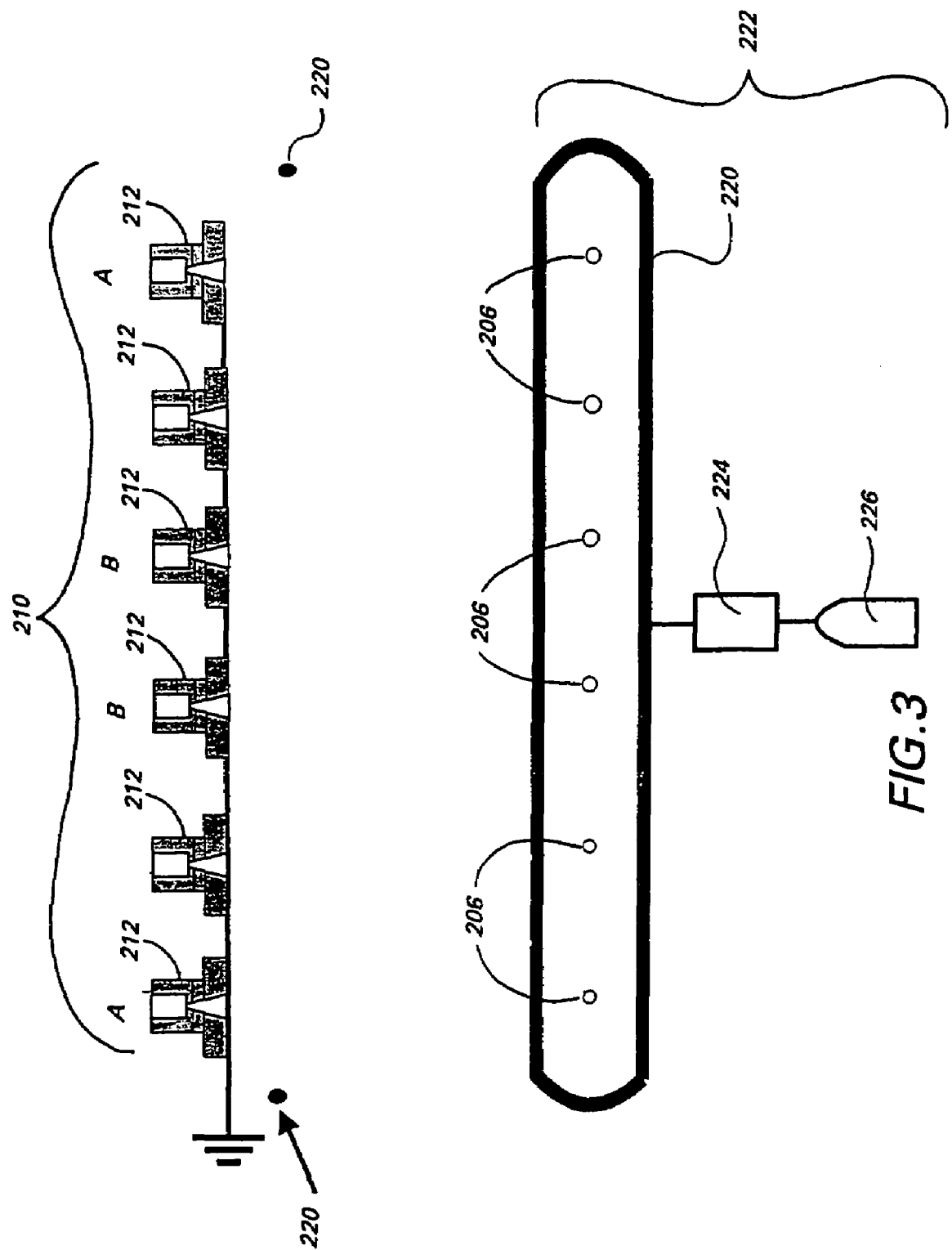
FIG. 3 is a schematic representation showing top and cross-sectional views of a common reactant gas injector of the present invention.

Common reactant gas injector 220 comprises a common injector ring 220, which is shown in cross-sectional and top views in FIG. 3. A separate common injection ring 220 may be provided for each reactant gas or a single common injection ring 220 can be used for the injection of a mixture of reactant gases. Common injector ring 220 is formed from a tubular-walled structure having an interior space through which the at least one reactant gas is supplied from reactant gas source 226 to each of the plurality of plasmas that are generated by the plurality of plasma sources 212 in array 210. Common injector ring 220 may be formed from stainless steel tubing having a thickness of about ⅝ inch (about 15.9 mm). The common injector ring 220 includes a plurality of orifices (not shown) located proximate to each of the plurality of plasmas. Each of the plurality of orifices extends through the tubular-walled structure from the interior space of the tubular-walled structure to an outer surface of the common injector ring 220. The plurality of orifices is oriented such that the at least one reactant gas passes from the interior space through the plurality of orifices and is directed into the each of the plurality of plasmas. Common injector ring 220 includes threaded holes that are spaced about 0.5 inch (about 12.7 mm) apart to allow for the insertion of a set screw having an orifice machined therethrough. The orifice may have a diameter of about 0.040 inch (about 1.02 mm).

Common reactant gas injector 220 may have a configuration other than that of a ring. For example, common reactant gas injector 220 may be formed from the tubular-walled structure having a plurality of orifices, as described above, into a single bar or other geometrical shapes such as, but not limited to, triangles, rectangles, and serpentines.

Generally, the flow rate through an orifice, or a plurality of orifices, is proportional to the ratio of the pressure drop a $\Delta P$ across the orifice (i.e., the difference in pressure inside the common reactant gas injector and the pressure in deposition chamber 204) to the conductance of the orifice:

Flow Rate $\propto \Delta P$/conductance.

When the pressure throughout the common reactant gas injector 220 and the pressure in deposition chamber 204 are relatively constant, $\Delta P$ is constant. Substantially equal flow of reactant gas to each of the plurality of plasmas may then be achieved by providing common reactant gas injector 220 having an equal number of orifices of the same diameter directing the at least one reactant gas into each of the plurality of plasmas. Thus, for orifices of equal size, the linear density of orifices proximate to a first plasma would be substantially equal to the linear density of orifices proximate to a second plasma. Achieving substantially equal flow rates when $\Delta P$ is constant may also be achieved by matching the conductances of the plurality of orifices that are proximate to each of the plurality of plasmas. Conductances may also be matched by adjusting either the linear density of orifices, orifice diameter, or orifice length.

In some instances, pressure may not be constant throughout common reactant gas injector 220. This condition may produce unequal flow of reactant gases into the plurality of plasmas that are generated by the plurality of plasma sources 212. A smaller amount of reactant gas, for example, may be directed into a plasma generated by a plasma source (labeled 'A' in FIG. 3) that is located more distant from the reactant gas source 226 than into a plasma source ('B' in FIG. 3) located closer to reactant gas source 226. Under these conditions, the flow rate of reactant gases to each of the plurality of plasmas may be equalized by modifying at least one of orifice diameters, linear densities of orifices, and the conductance of the plurality of orifices in common reactant gas injector 220. For example, the flow rate of reactant gases into the plasmas generated by plasma sources A and B may be equalized by providing common reactant gas injector 220 in the vicinity of plasma source A with a larger number of orifices than the number of orifices that are located in the vicinity of plasma source B. Alternatively, as shown in FIG. 7, the flow rate may be equalized by providing common reactant gas injector 220 with a greater linear density of orifices (A in FIG. 7) in the vicinity of plasma source A than the linear density of orifices (B in FIG. 7) in the vicinity of plasma source B. The flow rate of reactant gases may be equalized by providing common reactant gas injector 220 with orifices in the vicinity of plasma source A having diameters that are greater than the those of the orifices located in the vicinity of plasma source B. Finally, providing common reactant gas injector 220 with orifices having a lower conductance in the vicinity of plasma source A may be used to equalize the flow rates to plasmas generated by plasma sources A and B.

In the present invention, linear orifice density along common reactant gas injector ring 220 can, for example, be varied to equalize flow by replacing some of the set screws having orifices with regular set screws into which no orifices have been machined. Orifice conductance may also be varied by using extended set-screws with orifices machined therethrough.

Once injected into each of the plurality of plasmas, the at least one reactant gas undergoes at least one reaction within each of the plurality of plasmas. Such reactions may include, but are not limited to, charge exchange reactions, dissociative recombination reactions, and fragmentation reactions. Products from reactions that occur within the plurality of plasmas then combine to deposit a coating 232 on a surface 234 of substrate 230, which is contained in deposition chamber 204. Substrate 230 may either be statically mounted to a substrate holder (not shown) or coupled to a movement actuator (not shown), which moves (or 'scans') the substrate 230 with respect to the array 210.

The following examples serve to illustrate the features and advantages offered by the present invention, and is not intended to limit the invention thereto.

EXAMPLE 1

Figure 4:
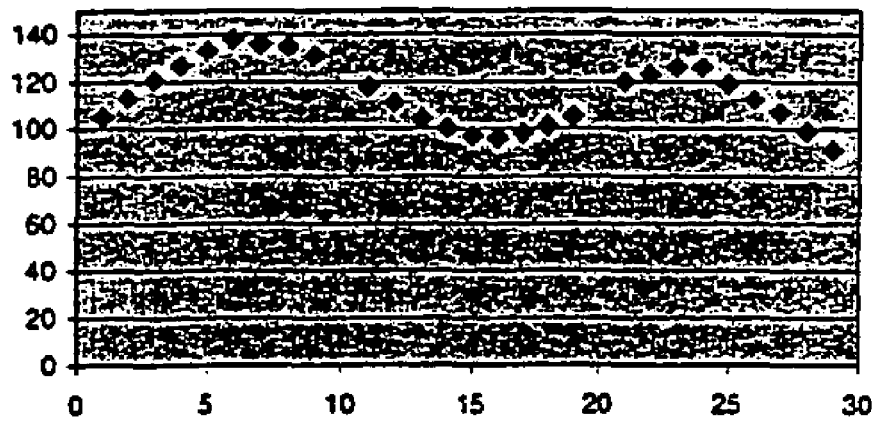
FIG. 4 is a plot comparing thickness profiles of amorphous hydrogenated silicon carbide (a-SiC:H) coatings deposited using the common reactant gas injector of the present invention and individual gas injectors, wherein the reactant gas is vinyltrimethylsilane (VTMS)
Figure 4:
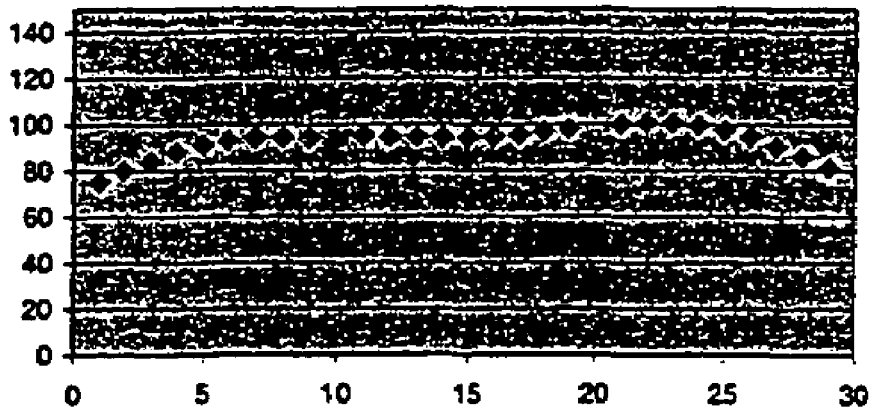

Experimental support for the invention is provided by comparing coatings deposited on a flat (i.e., planar) polycarbonate substrate using an array of ETP sources provided with a common reactant gas injection ring of the present invention with coatings that were deposited using an array of ETP sources provided with individual reactant gas injectors. Thickness profiles of amorphous hydrogenated silicon carbide (hereinafter referred to as "a-SiC:H") coatings obtained with an array of ETP sources in which the vinyltrimethylsilane (VTMS) precursor is delivered to nozzles of the individual ETP sources were compared to thickness profiles of a-SiC:H coatings that were obtained with VTMS using an array of ETP sources provided with the common reactant gas injector ring of the present invention. Thickness profiles of the coatings are shown in FIG. 4. The ratio of the standard deviation of thickness to the mean thickness (sigma/mean) at locations between the ETP sources for the coatings obtained using the common injector ring of the present invention (3%) is lower than that (13%) of films obtained using individual reactant gas injectors for each of the ETP sources. Thus, the coating obtained using the common injector gas ring of the present invention exhibits a higher degree of uniformity than the coating obtained using individual reactant gas injectors.

EXAMPLE 2

Figure 5:
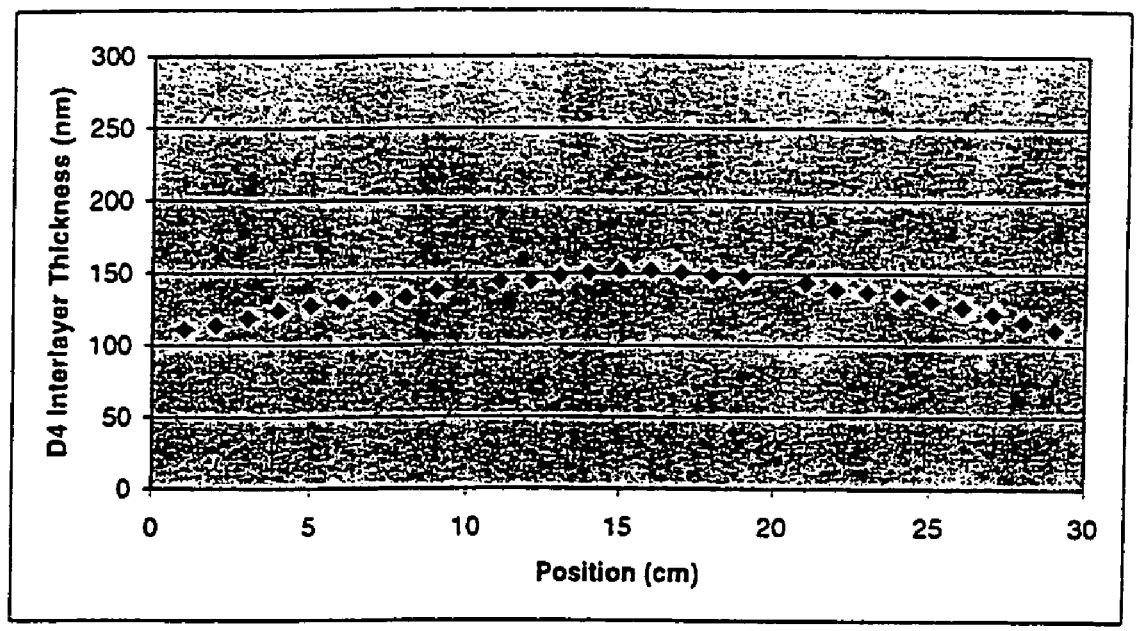
FIG. 5 is a plot of the thickness profile of an a-SiC:H coating obtained with an array of ETP sources in which the octamethylcyclotetrasiloxane (D4) reactant gas was provided to an array of ETP sources by the common reactant gas injector ring of the present invention.

The thickness profile of an a-SiC:H coating was obtained with an array of ETP sources in which the octamethylcyclotetrasiloxane (D4) reactant gas was provided by the common reactant gas injector ring of the present invention to the plasmas generated by an array of ETP sources. The thickness profiles of the deposited coating is shown in FIG. 5. The results demonstrate that the deposition with D4 results in a coating with 5% (sigma/mean) inter-ETP source thickness. Thus, the coating obtained by providing reactant gas D4 to the ETP-generated plasmas through the common injector gas ring of the present invention exhibits a high degree of uniformity.

EXAMPLE 3

Figure 6:
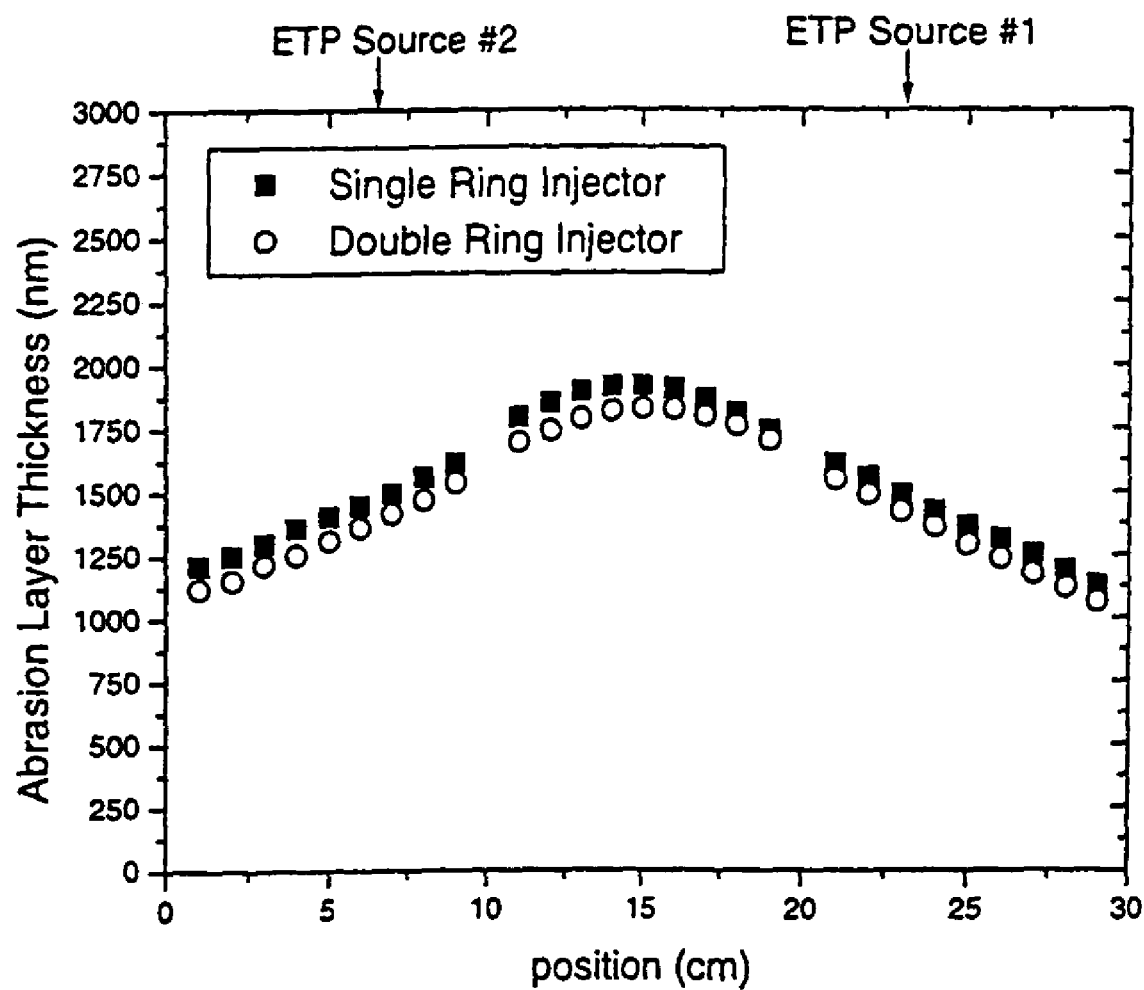
FIG. 6 is a plot comparing the thickness profiles of amorphous hydrogenated silicon oxycarbide (a-SiO$_x$C$_y$:H) coatings deposited from a mixture of D4 and oxygen (O$_2$) on polycarbonate substrates using a single common reactant injector and multiple common reactant injectors in accordance with the present

Coatings of amorphous hydrogenated silicon oxycarbide (hereinafter referred to as "a-SiO$_x$C$_y$:H"), which can serve as abrasion resistant coatings, are deposited from a mixture of D4 and oxygen (O$_2$) on polycarbonate substrates. In one experiment, the coating was deposited by injecting both D4 and O$_2$ through a single common reactant gas injector ring. In another experiment, the coating was deposited by injecting O$_2$ and D4 through separate common reactant gas injector rings. The coating thickness profiles of the deposited coatings are compared in FIG. 6. The thickness profiles in FIG. 6 are not statistically different, thus demonstrating that individual reactant gases may be provided to the plasmas generated by the plurality of ETP plasmas by either a single common reactant gas injector or separate common gas injectors to yield coatings having a high degree of uniformity.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention. For example, the invention is not necessarily limited to the use of an array of multiple ETP sources, but instead be useful in any array of multiple plasma sources that may be used to coat large area substrates.

What is claimed is:

1. A method of depositing a uniform coating on a planar surface of a substrate, the method comprising the steps of:
   a) providing the substrate having the planar surface to a deposition chamber;
   b) evacuating the deposition chamber to a predetermined deposition pressure;
   c) generating a plurality of plasmas from at least one linear array of a plurality of plasma sources;
   d) injecting at least one reactant gas into each of the plurality of plasmas through at least one common reactant gas injector such that a first flow rate of the at least one reactant gas into a first plasma is substantially equal to a second flow rate of the at least one reactant gas into a second plasma, wherein said at least one common reactant gas injector comprises a tubular-walled structure having two linear portions parallel to each other and two end portions connecting the linear portions and is disposed between anodes of the plasma sources and the substrate and is circumferentially disposed with respect to the plasma sources;
   e) flowing the at least one reactant gas and the plurality of plasmas into the deposition chamber toward the substrate; and
   f) reacting the at least one reactant gas with the plurality of plasmas to form the coating on the planar surface of the substrate.

2. The method according to claim 1, wherein at least one of the plurality of plasma sources is an expanding thermal plasma source having a cathode, one of said anodes and an inlet for a non-reactive plasma source gas disposed in a plasma chamber.

3. The method according to claim 2, wherein the step of flowing the at least one reactant gas and the plurality of plasmas into the deposition chamber toward the substrate includes the steps of:
   a) maintaining the deposition chamber at a second predetermined pressure, wherein the second predetermined pressure is less than a first pressure in the plasma chamber; and
   b) expanding the plurality of plasmas from the plasma chamber into the deposition chamber toward the substrate.

4. The method according to claim 1, wherein the step of injecting the at least one reactant gas into the plurality of plasmas comprises:
   a) supplying the at least one reactant gas from a reactant gas source to the at least one common reactant gas injector;
   b) passing the at least one reactant gas through a first plurality of orifices in the common reactant gas injector proximate to the first plasma and a second plurality of orifices proximate to the second plasma;
   c) directing the at least one reactant gas through the first plurality of orifices into the first plasma at a first flow rate; and
   d) directing the at least one reactant gas through the second plurality of orifices into the second plasma at a second flow rate, the first flow rate being substantially equal to the second flow rate.

5. The method according to claim 4, wherein the first plurality of orifices comprises a first predetermined number of orifices and the second plurality of orifices comprises a second predetermined number of orifices, and wherein the first predetermined number is equal to the second predetermined number.

6. The method according to claim 4, wherein the first plurality of orifices comprises a first predetermined number of orifices and the second plurality of orifices comprises a second predetermined number of orifices, and wherein the first predetermined number is different from the second predetermined number.

7. The method according to claim 4, wherein each of the first plurality of orifices has a first conductance and each of the second plurality of orifices has a second conductance, wherein the first conductance is equal to the second conductance.

8. The method according to claim 4, wherein each of the first plurality of orifices has a first conductance and each of the second plurality of orifices has a second conductance, wherein the first conductance is different form the second conductance.

\* \* \* \* \*